United States Patent [19]
Durham et al.

[11] Patent Number: 6,131,869
[45] Date of Patent: Oct. 17, 2000

[54] LADDER DEFLECTING DEVICE

[75] Inventors: James H. Durham, Reston; Charles W. Cramp, Woodbridge, both of Va.

[73] Assignee: Hubbell Incorporated, Orange, Conn.

[21] Appl. No.: 09/128,003

[22] Filed: Aug. 3, 1998

[51] Int. Cl.[7] .................................................. A47B 95/00
[52] U.S. Cl. ......................... 248/345.1; 292/342; 182/39
[58] Field of Search ............................... 248/345.1, 300; 292/342, 343, DIG. 15; 182/39, 38

[56] References Cited

U.S. PATENT DOCUMENTS

| | | | |
|---|---|---|---|
| 372,655 | 11/1887 | Cashin | 248/345.1 |
| 623,749 | 4/1899 | Weathers | 248/345.1 |
| 1,500,562 | 7/1924 | Hopf | 292/343 |
| 1,515,486 | 11/1924 | Hopf | 292/343 |
| 1,922,298 | 8/1933 | Jones | 292/342 |
| 1,937,548 | 12/1933 | Chambers | 292/342 |
| 1,938,818 | 12/1933 | Erickson et al. | 248/300 |
| 1,976,579 | 10/1934 | Reynolds | 292/342 |
| 3,247,779 | 4/1966 | Willman | 248/300 |
| 3,458,964 | 8/1969 | Guilliam | 248/300 |
| 3,653,701 | 4/1972 | Harvey | 292/343 |
| 3,970,170 | 7/1976 | Darling | 182/230 |
| 4,440,095 | 4/1984 | Mathieu | 105/225 |
| 4,709,897 | 12/1987 | Mooney | 248/300 |

*Primary Examiner*—Anita M. King
*Assistant Examiner*—Kimberly T. Wood
*Attorney, Agent, or Firm*—Jerry M. Presson; Leopold Presser

[57] ABSTRACT

A device for deflecting ladders and other moving structures away from sensitive and readily damageable stationary equipment. More particularly, disclosed is a device in the form of a wedge-shaped ramp structure which is mounted at the end of a guard rail located at the bottom of the stationary equipment which is arranged in an uneven lineup and presenting protruding end edges which the ramp structure will prevent from being struck by moving aisle ladders or the like through deflecting the latter. Pursuant to a specific aspect, the device is a wedge-shaped deflector ramp structure mounted at the end of the guard rail which is located to extend along the lower end of a forward surface of unequal flange cable duct (UFCD) racks which are frequently employed in telephone or communication equipment central offices.

10 Claims, 2 Drawing Sheets

LADDER DEFLECTING DEVICE

BACKGROUND OF THE INVENTION

1. Field of the Invention

The present invention relates to a device for deflecting ladders and other moving structures away from sensitive and readily damageable stationary equipment. More particularly, the invention is directed to a device in the form of a wedge-shaped ramp structure which is mounted at the end of a guard rail located at the bottom of the stationary equipment which is arranged in an uneven lineup and presenting protruding end edges which the ramp structure will prevent from being struck by moving aisle ladders or the like through deflecting the latter. Pursuant to a specific aspect, the invention is directed to a wedge-shaped deflector ramp structure mounted at the end of the guard rail which is located to extend along the lower end of a forward surface of unequal flange cable duct (UFCD) racks which are frequently employed in telephone or communication equipment central offices.

2. Discussion of the Prior Art

Telephone central offices are frequently equipped with extensive racks of so-called unequal flange cable ducts (UFCD), and are employed for the housing of sensitive and easily damaged cable, communications and telephone equipment. These UFCD racks extend normally end-to-end along aisles wherein aisle ladders are adapted to move or roll in the aisles adjacent to and along the telephone equipment racks so as to enable operating and service personnel to reach higher located telephone equipment in the racks. Quite frequently, the contiguously end-to-end positioned sections of racks are offset relative to each other transversely of the direction extending along the length of the aisle, thereby forming sharp corners or set back edges at their junctures, which can be struck by rolling aisle ladders and other items transported in the aisle.

SUMMARY OF THE INVENTION

In order to prevent any damage being encountered by the cable duct racks and the telephone equipment contained therein upon being struck at their junctures by rolling aisle ladders or other movable equipment, there is provided a wedge-shaped deflecting device at the setbacks or offsets between adjoiningly located cable duct racks. The wedge-shaped deflecting device forms a ramp structure which is mounted at the end of a guard rail located at the bottom end of a forwardly protruding unequal flange cable duct rack, and tapers rearwardly towards the front face of a guard rail of a setback adjoining cable duct rack, thereby eliminating the sharp edge or set back corner between the racks.

The installation of the wedge-shaped ramp structure provides for an angled or sloped transition such that any ladder or moving equipment passing in the aisle and coming into contact with the guard rail of a setback uneven flanges cable duct rack and moving towards the further cable duct rack which extends forwardly offset into the aisle will be deflected a way therefrom into the aisle under the guidance of the wedge-shaped deflection device mounted in the adjacent end of the guard rail of the forwardly offset cable rack. In essence, this deflecting action will prevent any damage being encountered by the forwardly offset cable duct rack and the telephone equipment contained therein.

Within the purview and scope of the invention, it is also possible to contemplate a series of deflecting devices being installed in the ends of the guard rails of a lineup of alternatively forwardly offset and set back cable duct racks along the length of an aisle, and the devices being attached to the guard rails of each forwardly offset cable duct rack by means of suitable fastening elements so as to form ramp structures between each of the mutually offset unequal flange cable duct racks.

In order to attain the foregoing, the deflection device pursuant to the present invention includes a first member comprising an essentially beam-like structure having an upstanding web at the ends of which are parallel flanges extending towards one side to form a cross-section frequently referred to as a C-beam. The first beam is extended for a portion of its length into the open end of a hollow box-shapes guard rail extending along the front lower edge of the forwardly offset cable duct rack; and with holes being drilled through the web of this C-shaped beam which is aligned with a suitable hole drilled through the wall structure of the guard rail, and adapted to have a fastening element passing therethrough so as to lock the beam into fixed clamping engagement therewith. A second, somewhat larger dimensioned C-shaped beam is adapted to be positioned rearwardly over the protruding end portion of the first beam member, so as to have its web in surface contact with the guard rail of the adjoining setback cable duct rack, and includes one or more apertures drilled therethrough which are adapted to be aligned with apertures in the web of the first C-beam, and fastened thereto through suitable fastening elements. The larger C-beam has the upper and lower horizontally projecting flanges tapered towards the distal end extending coaxially away from the guard rail of the forwardly offset cable duct rack.

This, in essence will produce a wedge-shaped ramp structure forming a deflecting device which, upon being contacted by a moving object, such as a ladder being rolled down the aisle, will deflect the lower end of the ladder, or any moving object, away from the cable duct racks so as to prevent any damage from being sustained by equipment contained in the racks.

Accordingly, it is an object of the present invention to provide a deflection device for protecting sensitive equipment stored in cable duct racks from moving structures tending to impact against the racks.

Another more specific object of the present invention is to provide a deflection device mounted on mutually offset unequal flange cable duct racks which are in an inline end-to-end position so as to deflect ladders rolling in an aisle along the racks from damaging the racks and telephone equipment therein upon striking thereagainst.

A still further object of the present invention is to provide to a deflection device which is adapted to be fastened to the ends of guard rails positioned at the lower front ends of unequal flange cable duct racks which are offset relative to each other, so as to provide a ramp structure forming an inclined surface adapted to deflect rolling or moving structures, such as ladders or objects moving in an aisle in front of the cable duct racks away from the racks and equipment therein so as to prevent any damaging thereof.

BRIEF DESCRIPTION OF THE DRAWINGS

Reference may now be had to the following detailed description of a preferred embodiment of the invention, taken in conjunction with the accompanying drawings; in which.

DETAILED DESCRIPTION OF A PREFERRED EMBODIMENT

Figure 1:
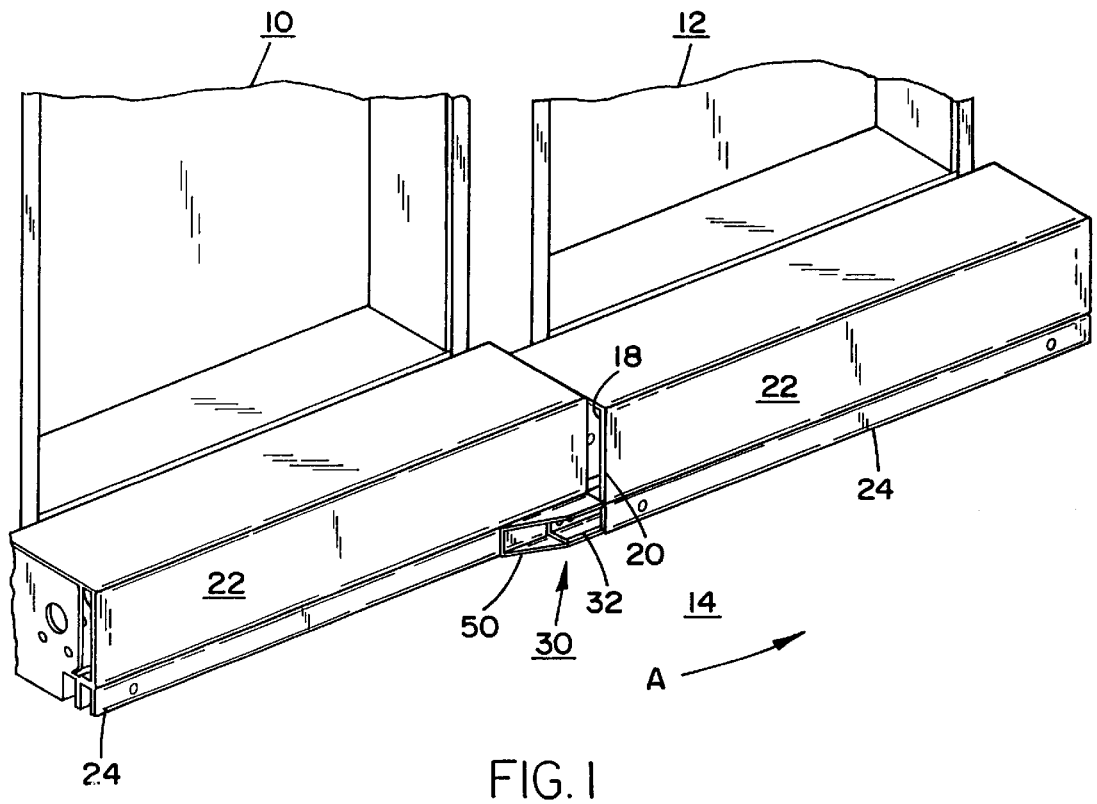
FIG. 1 illustrates a perspective view of a pair of unequal flange cable duct (UFCD) racks positioned in an inline mutually offset end-to-end relationship so as to extend along an aisle.

Referring in detail to the drawings, particularly as shown in FIG. 1, a pair of unequal flange cable duct (UFCD) racks 10, 12 adapted to contain sensitive equipment, such as telephone cables, components and the like as would be installed in telephone central offices, are shown offset relative to each other with regard to an aisle 14. The duct racks 10, 12 are located in linear contiguous end-to-end positions extending along the aisle. The offset 18 defines an edge between the cable duct racks 10, 12 oriented perpendicularly to the axis of the aisle 14 so as to form a ledge or setback 20 which, when struck by an object moving along the aisle towards the forwardly offset cable duct rack 12, such as a rolling ladder may cause damage to the telephone equipment housed-therein.

The lower front surface 22 of each unequal flange cable duct rack 10, 12 is equipped with a guard rail 24 which is essentially of hollow box-shaped like construction in cross-section, and which runs along the front edge of the cable duct racks. However, inasmuch as the cable duct racks 10, 12 are offset relative to each other, as previously mentioned, at the location of the juncture between the racks there is present a relatively sudden setback such that; for example, rolling ladders passing therealong in the aisle 14 may strike against the protruding end surface of the forwardly located cable duct rack 12, thereby possibly resulting in serious damage to the racks and the equipment contained therein.

Accordingly, in order to prevent damage from rolling ladders or other moving objects being imparted to the cable duct racks and the equipment contained therein, due to the ladder striking against the end surface, pursuant to the invention, there is provided a novel ladder deflection device 30, having particular reference to the illustrated drawings. The deflection device 30 is basically a wedge-shaped structure forming a ramp which extends from the end of the guard rail 24 of the forwardly offset unequal flange cable duct rack 12 along the front surface of the guard rail 24 of the setback cable duct rack 10, thereby forming an incline or sloped transitional surface which at the juncture between the cable duct racks 10, 12, when struck by an object moving along the aisle, such as a rolling ladder, will deflect the latter outwardly into the aisle, thereby preventing any damage to the forwardly offset or protruding unequal flange cable duct rack 12 and the equipment contained therein.

Figure 3:
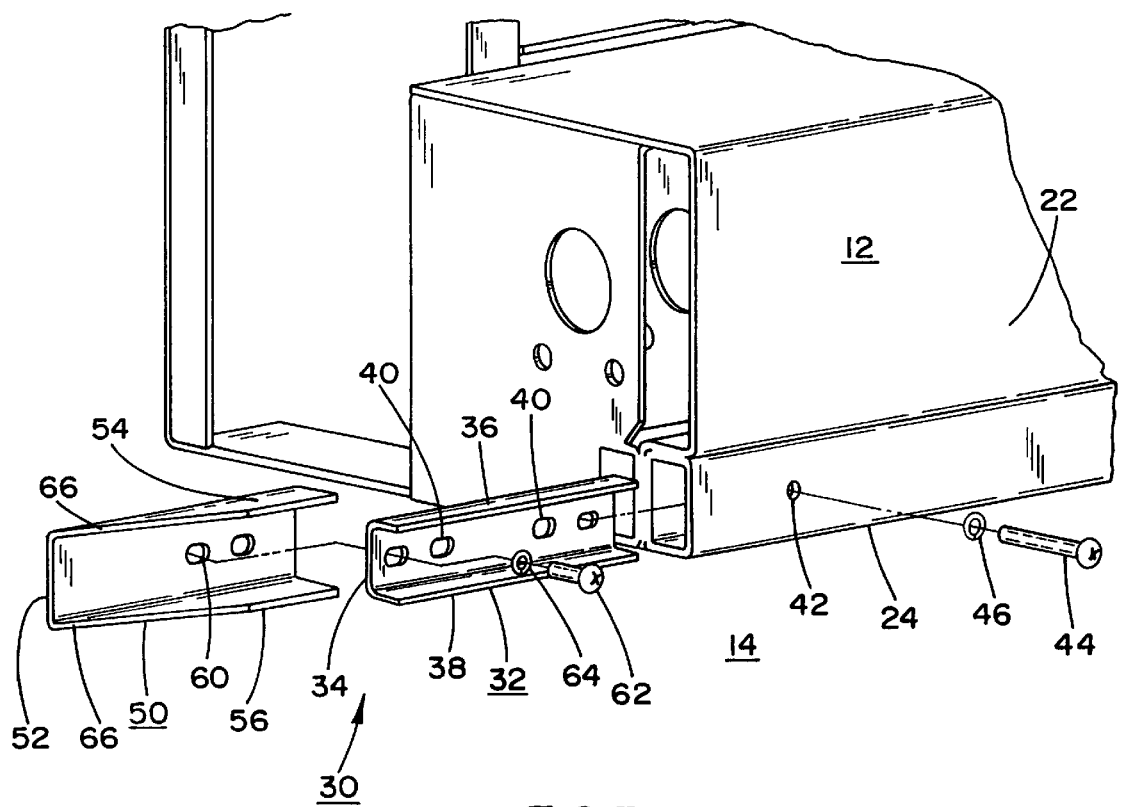
FIG. 3 illustrates, on an enlarged scale, an exploded perspective view of a lower end portion of one of the unequal flange cable duct racks showing the inventive deflection device being assembled into a guard rail of the cable duct.

In order to provide a simple, yet highly effective deflection device 30, as illustrated in detail in an exploded representation in FIG. 3 of the drawings, the device comprises a C-beam 32 having an upstanding web 34 and upper and lower flanges 36, 38, with a plurality of through-holes 40 being drilled through the web. One end portion of the C-beam 32 is adapted to be inserted into the hollow box-like interior of the guard rail 24 of the forwardly offset unequal flange cable duct rack 12, with the outer wall of the guard rail having a threaded hole 42 drilled therethrough, and with a screw 44 being insertable therein upon the end portion of the C-beam 32 being inserted into the guard rail 24. When a respective one of the holes 40 and the hole 42 are in alignment, the screw 44 with a lock washer 46 thereon is threaded therethrough so as to secure the beam 32 within in the guard rail 24, with a further portion of the C-beam extending outwardly from the end thereof, as can be seen from FIG. 1 of the drawings. Thereafter, a somewhat larger-dimensioned second C-beam 50 is slid over the C-beam 32, with the web 52 of beam 50 being in surface contact with the backside of web 34, and the upper and lower flanges 54, 56 of beam 50 being located, respectively, above and below the flanges 36, 38 of beam 32. A portion of beam 50 extends coaxially beyond the protruding end of beam 32, as shown in FIG. 1. With the front surface of the web 52 of the larger C-beam 50 being positioned flush against the back surface of the web 34 of C-beam 32, the holes 40 formed at that end of the C-beam 32 are located in alignment with similar holes 60 in the web 52 of the C-beam 50. The C-beams 32, 50 are adapted to be fastened together by means of one or more suitable screw elements 62 and lock washers 64 so as to be in a fixed relationship with each other, with the rear surface of web 52 of beam 50 being located proximate the guard rail 24 of the set back cable duct rack 10.

The C-beam 50 which is fastened to the C-beam 32 extending from the guard rail 24 of the forwardly offset unequal flange cable duct rack 12 has the flanges 54, 56 tapered along a head end portion 66 so as to provide a forwardly extending wedge shaped ramp structure between the unequal flange cable duct racks 10, 12.

Figure 2:
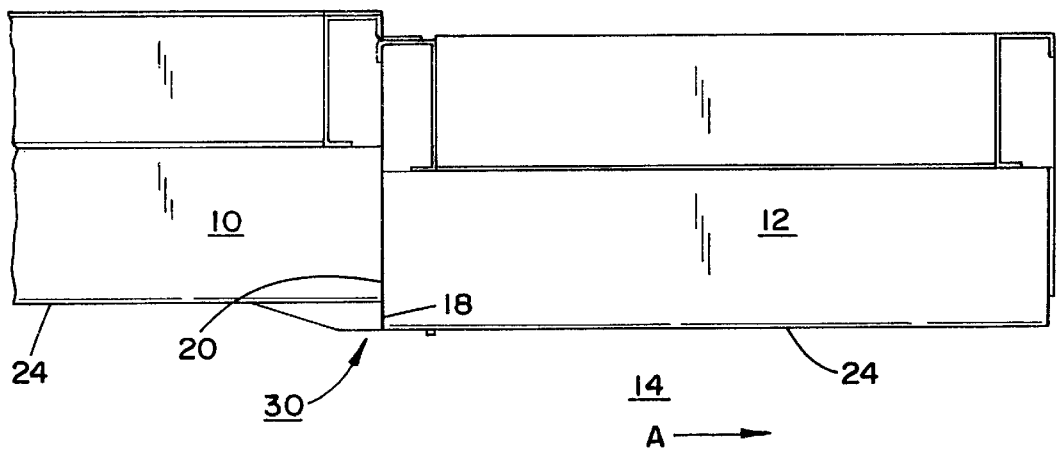
FIG. 2 illustrates a top plan view of the mutually offset unequal flange cable duct racks showing the deflection device pursuant to the invention adapted to deflect objects moving in the aisle end tending to strike against the location of juncture between the cable racks.

This ramp structure produced by the tapered flange head end portions 66 causes any object which moves along the aisle in the direction of arrow A in FIGS. 1 and 2 in close proximity with the guard rail 24 of the recessed cable duct rack 10; for example, such as the lower end of a rolling ladder passing along the aisle, and as it approaches the forwardly offset cable duct rack 12, to strike against the ramp structure formed by the upper and lower flanges 54, 56 of the deflection device 30, and to be displaced outwardly into the aisle away from the forwardly offset unequal flange cable duct rack 12. As a result, this may prevent any damage to the cable duct racks and any highly sensitive and expensive communications equipment contained therein, due to the smooth outward deflection of any moving objects into the aisle by means of the deflection device 30. The components of the deflection device may be constructed from readily available C-beams of either metal or high impact molded plastic, which are cut to suitable lengths.

While there has been shown and described what is considered to be a preferred embodiment of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. A deflection device for deflecting objects movable in an aisle containing stationary equipment positioned along said aisle, said stationary equipment having at least two contiguous surface portions facing said aisle which are offset relative to each other so as to form a generally perpendicular setback for receiving said deflection device at a juncture between said offset surface portions; said deflection device comprising a wedge-shaped ramp structure forming an inclined surface for deflecting objects coming into contact therewith outwardly into the aisle, said ramp structure consisting of beam components comprising a first beam element fastenable to a first said surface portion, and a second beam element fastened to said first beam element, said second beam element having tapered surfaces forming said inclined ramp structure, said first beam element comprises a C-beam having an upright web and upper and lower flanges horizontally extending from said web, said second beam element comprises a second C-beam having an upright web and upper and lower flanges horizontally extending from said web, said second C-beam being larger than said first C-beam and being superimposed thereon such that the front surface of the web of the larger C-beam lies against the rear surface of the web of the first C-beam, the upper and lower flanges of the second C-beam extending over respectively the upper and lower flanges of the first C-beam.

2. A deflection device as claimed in claim 1, wherein the bottom portions of each of said surface portions are guard rails forming contact surfaces for said movable objects, said ramp structure being mountable at the end of the guard rail of the forwardly offset equipment surface portions to form the transition surface towards the guard rail of the set back equipment surface portion.

3. A deflection device as claimed in claim 2, wherein said guard rails are each of a hollow box-shaped cross-section, said ramp structure being fastenable to the interior of the guard rail of the forwardly offset equipment surface portion.

4. A deflection device as claimed in claim 2, wherein fastener means are adapted to fixedly connect said first beam element to said guard rail.

5. A deflection device as claimed in claim 1, wherein the second C-beam extends axially outwardly of the portion of the first C-beam projecting from the guard rail, at least a portion of the length of the upper and lower flanges of the second C-beam being tapered toward the web of said C-beam towards the outer end of said second C-beam so as to form said wedge-shaped ramp structure.

6. A deflection device as claimed in claim 1 wherein fastener means fixedly interconnect said first and second beam elements.

7. A deflection device as claimed in claim 6, wherein said fastener means for said first and second beam elements comprises at least one fastening screw and lock washer.

8. A deflection device as claimed in claim 4, wherein said fastener means for said first beam element and guard rail comprises at least one fastening screw and lock washer.

9. A deflection device as claimed in claim 1, wherein said stationary equipment comprises at least two unequal flange cable duct racks.

10. A deflection device as claimed in claim 1, wherein said ramp structure is adapted to deflect rolling ladders traveling along said aisle.

* * * * *